(12) United States Patent
Subramani

(10) Patent No.: US 11,908,820 B2
(45) Date of Patent: Feb. 20, 2024

(54) DUAL SOLDER METHODOLOGIES FOR ULTRAHIGH DENSITY FIRST LEVEL INTERCONNECTIONS

(71) Applicant: Intel Corporation, Santa Clara, CA (US)

(72) Inventor: Chandramouleeswaran Subramani, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/668,246

(22) Filed: Feb. 9, 2022

(65) Prior Publication Data

US 2022/0165697 A1 May 26, 2022

Related U.S. Application Data

(63) Continuation of application No. 15/845,992, filed on Dec. 18, 2017, now Pat. No. 11,322,469.

(51) Int. Cl.
*H01L 23/00* (2006.01)
*H01L 23/31* (2006.01)
(Continued)

(52) U.S. Cl.
CPC ............ *H01L 24/16* (2013.01); *G06F 13/102* (2013.01); *H01L 23/3157* (2013.01);
(Continued)

(58) Field of Classification Search
CPC ..... H01L 24/16; H01L 23/3157; H01L 24/13; H01L 24/81; H01L 25/18; H01L 21/563; H01L 2224/0401; H01L 2224/13026; H01L 2224/13109; H01L 2224/13111; H01L 2224/13113; H01L 2224/13118; H01L 2224/13124; H01L 2224/13138; H01L 2224/13139; H01L 2224/13144; H01L 2224/13147; H01L 2224/16157; H01L 2224/16503; H01L 2224/32225; H01L 2224/73204; H01L 2224/8112;
(Continued)

(56) References Cited

U.S. PATENT DOCUMENTS

| 2002/0151164 A1 | 10/2002 | Jiang et al. |
| 2003/0146268 A1 | 8/2003 | Hofstee et al. |

(Continued)

OTHER PUBLICATIONS

Notice of Allowance for U.S. Appl. No. 15/845,992, dated Jan. 11, 2022.

(Continued)

*Primary Examiner* — Thanh T Nguyen
(74) *Attorney, Agent, or Firm* — Essential Patents Group, LLP

(57) ABSTRACT

An apparatus, comprising an integrated circuit (IC) package having at least one solder bond pad, a die having at least one solder bond pad, wherein the die is bonded to the IC package by at least one solder joint between the at least one solder bond pad of the die, and the at least one solder bond pad of the IC package, and an underfill material between the IC package and the die, wherein the at least one solder joint is embedded in the underfill material, and wherein the at least one solder joint comprises a first metallurgy and a second metallurgy.

20 Claims, 11 Drawing Sheets

(51) Int. Cl.
  *G06F 13/10* (2006.01)
  *H01L 25/18* (2023.01)
  *H01L 21/56* (2006.01)

(52) U.S. Cl.
  CPC .............. *H01L 24/13* (2013.01); *H01L 24/81* (2013.01); *H01L 25/18* (2013.01); *H01L 21/563* (2013.01); *H01L 2224/0401* (2013.01); *H01L 2224/13026* (2013.01); *H01L 2224/13109* (2013.01); *H01L 2224/13111* (2013.01); *H01L 2224/13113* (2013.01); *H01L 2224/13118* (2013.01); *H01L 2224/13124* (2013.01); *H01L 2224/13138* (2013.01); *H01L 2224/13139* (2013.01); *H01L 2224/13144* (2013.01); *H01L 2224/13147* (2013.01); *H01L 2224/16157* (2013.01); *H01L 2224/16503* (2013.01); *H01L 2224/32225* (2013.01); *H01L 2224/73204* (2013.01); *H01L 2224/8112* (2013.01); *H01L 2224/81193* (2013.01); *H01L 2224/81815* (2013.01); *H01L 2224/92125* (2013.01); *H01L 2924/014* (2013.01); *H01L 2924/01032* (2013.01)

(58) Field of Classification Search
  CPC . H01L 2224/81193; H01L 2224/81815; H01L 2224/92125; H01L 2924/01032; H01L 2924/014; H01L 24/32; H01L 24/73; H01L 24/92; H01L 2224/05647; H01L 2224/11462; H01L 2224/11464; H01L 2224/11849; H01L 2224/13082; H01L 2224/13117; H01L 2224/16227; H01L 2224/16237; H01L 2224/2919; H01L 2224/8103; H01L 2224/81191; H01L 2224/81203; H01L 2224/81447; H01L 2224/8181; H01L 2924/3511; G06F 13/102

See application file for complete search history.

(56) References Cited

U.S. PATENT DOCUMENTS

| | | | |
|---|---|---|---|
| 2006/0011711 | A1 | 1/2006 | Mino |
| 2007/0178688 | A1 | 8/2007 | Shiu et al. |
| 2012/0306104 | A1 | 12/2012 | Choi et al. |
| 2014/0008114 | A1 | 1/2014 | Sakuyama et al. |
| 2014/0065771 | A1* | 3/2014 | Gruber ................ H05K 3/3436 257/E21.506 |
| 2014/0225265 | A1 | 8/2014 | Sidhu et al. |
| 2014/0291843 | A1 | 10/2014 | Jiang et al. |
| 2015/0179570 | A1* | 6/2015 | Marimuthu ............ H01L 24/97 438/126 |

OTHER PUBLICATIONS

Office Action for German Patent Application No. 10-2018128879.4, dated Jan. 19, 2021.
Office Action for U.S. Appl. No. 15/845,992, dated Aug. 4, 2021.
Office Action from German Patent Application No. 102018128879.4 dated Aug. 31, 2023, 16 pgs.

* cited by examiner

DUAL SOLDER METHODOLOGIES FOR ULTRAHIGH DENSITY FIRST LEVEL INTERCONNECTIONS

CLAIM FOR PRIORITY

This application is a continuation of, and claims the benefit of priority to U.S. patent application Ser. No. 15/845,992, filed on Dec. 18, 2017, titled "DUAL SOLDER METHODOLOGIES FOR ULTRAHIGH DENSITY FIRST LEVEL INTERCONNECTIONS", which is incorporated by reference in its entirety.

BACKGROUND

As increasing demands are placed on microelectronics packaging technologies to scale down package footprint and thickness, interconnect dimensions must also be scaled down. As first level interconnect (FLI) pitches decrease for building ultrahigh density architectures, challenges arise for bonding integrated circuit dies to package substrates. One problem is the incidence of solder bridge formation. Another problem are low yields of finished packages due to warpage-associated incomplete solder joint formation (e.g., non-contact opens) between bond pads on both die and substrate during thermal compression bonding operations.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
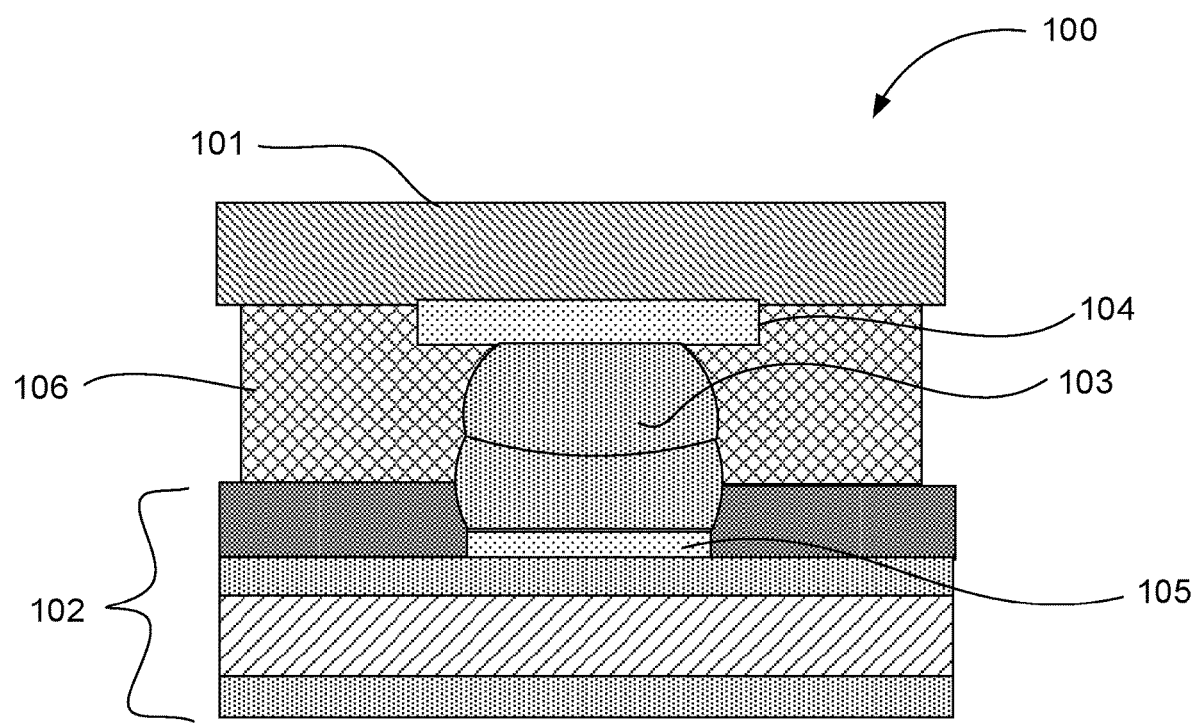
FIG. 1 illustrates a cross-sectional view of a first embodiment of a package having a dual solder joint embodiment between a die and substrate having an underfill, according to some embodiments of the disclosure, according to some embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged Integrated Circuit (ICs) and discrete components, forming a larger circuit.

Here, the term "dielectric" generally refers to any number of non-conductive materials that make up the structure of a package substrate. For purposes of this disclosure, dielectric material may be incorporated into an IC package as layers of laminate film or as a resin molded over IC dies mounted on the substrate.

Here, the term "metallization" generally refers to metal layers formed over the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in microelectronic packages and dies.

Here, the term "solder bump" generally refers to a solder layer formed on a bond pad. The solder layer typically has a round shape, hence the term "solder bump".

Here, the term 'liquidus" generally refers to the liquid state of a molten metallic mixture, such as solder. There is no specific melting point as the solder melts over a temperature range. The liquidus state is the state where the mixture is completely melted.

Here, the term "solidus" generally refers to the solid state of a solid metallic mixture, such as solder. As for the liquidus state, there is no specific solidification temperature as the liquid mixture solidifies over a temperature range. The solidus temperature is the temperature where the mixture is completely solidified.

Here, the term "metallurgy" generally refers to an alloy composition. In this disclosure, "metallurgy" is used to represent solder alloy compositions, for example.

Disclosed herein is a method for a touch and bond dual solder metallurgy on the die and package substrate, and structures made by the disclosed method. The method comprises a touch-and-bond process, where two solder layers are deposited on bond pads of a die and a package substrate. The solder layers have different compositions having disparate liquidus temperatures. In some embodiments, the two solder layers are formed separately, where a first solder layer comprising a solder composition having a first liquidus temperature $T_{L1}$ is deposited on the die, and a second solder layer comprising a solder composition having a second liquidus temperature ($T_{L2}$, where $T_{L2}$ is greater than $T_{L1}$) is deposited on the substrate. The solder layers are then joined by juxtaposing the bond pads of the die and substrate.

In some embodiments, the two solder layers are formed in succession on the bond pads of the die or on the substrate. In some embodiments, the first solder layer is formed on bond pads of the substrate, then heated to a temperature where an intermetallic compound (IMC) is formed between the material of the bond pad (e.g., copper) and one or more metal elements of the solder layer (e.g., tin). The IMC has a melting point significantly higher than the liquidus temperatures of the two solder compositions.

The second solder layer is formed on the bond pads of the die. Bond pads of the die and the substrate are juxtaposed. According to some embodiments, the juxtaposed bond pads on the die and substrate are contacted under pressure and heated. As an example, the die and substrate are brought into contact in a thermal compression bonding (TCB) tool. The temperature is raised to the first (e.g., lower) liquidus temperature, where the first solder layer melts and is reflowed to form partial solder joints between the bond pads of the die and substrate. According to embodiments, the volume of the solder contained within the first solder layer is relatively low relative to the volume of solder contained within the second solder layer. As a result, the partial solder joints are small, and form a temporary bond between the die and substrate. The temporary bond serves to hold the die and substrate together as a mechanically stable unit for further processing before a complete solder joint is formed. The second solder layer remains intact, as the first temperature is too low to melt second layer.

As pointed out above, solder bridging is a common occurrence when bonding (e.g., flip-chip bonding) dies and substrates designed with high-density FLI architectures. In some embodiments, an underfill material is injected between the die and the substrate then cured, embedding the partial solder joints in the underfill material. The embedded partial solder joints comprise the intact second solder layer. In a subsequent operation, the partial solder joints are heated to the second liquidus temperature ($T_{L2}$) or above, where the second solder layer is melted and reflowed to form a permanent solder joint between the bond pads of the die and the substrate. During reflow of the second solder layer, the melt is confined within a cavity within the surrounding underfill material, the larger volume of liquid solder (relative to the first solder layer volume) not able to flow over to the neighboring bond pad pair. In this way, solder bridging is eliminated.

In an alternative embodiment, the second solder layer is formed on the bond pads of the substrate. The second solder layers formed on individual bond pads may take on the shape of a ball or a bump. Typically, the height of the bumps as formed may vary in thicknesses on each bond pad by 10-20%. This variation may translate to differences in solder bumps by as much as 10 microns. While natural warpage is present in the die and substrate, if bonded in a TCB or similar tool, the substrate and die are held flat. However, the variation in bump height can result in some non-contact opens (NCOs), or failure to form solder joints between some of the bond pad pairs.

To avoid the variation of solder bump height, the solder bumps are flattened by pressing the solder bumps, for example, in a TCB tool, to level the bumps to a substantially equal height before subsequent bonding operations.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

FIG. 1 illustrates a cross-sectional view of a first embodiment of package 100, having a dual solder joint embodiment between a die and substrate having an underfill, according to some embodiments of the disclosure.

In FIG. 1, package 100 comprises die 101 and substrate 102. Solder joint 103 is between, and bonded to, bond pad 104 on die 101 and bond pad 105 on substrate 102. Solder joint 103 is composed of metallurgies (alloys) that may comprise, but are not limited to, metals such as tin, silver, copper, bismuth, zinc, indium, gold, aluminum, and germanium. In some embodiments, solder joint 103 comprises a compositional gradient of tin concentration between bond pad 104 and bond pad 105. In some embodiments, solder joint 103 comprises a concentration of tin adjacent to bond pad 104 on die 101 that is higher than the concentration of tin adjacent to bond pad 105 on substrate 102.

In some embodiments, solder joint 103 comprises a compositional gradient of gold concentration between bond pad 104 and bond pad 105. In some embodiments, solder joint 103 comprises a concentration of gold adjacent to bond pad 105 that is higher than the concentration of gold adjacent to bond pad 104.

In some embodiments, solder joint 103 comprises a compositional gradient of gold concentration between bond pad 104 and bond pad 105. In some embodiments, solder joint 103 comprises a concentration of gold adjacent to bond pad 104 that is higher than the concentration of gold adjacent to bond pad 105.

In some embodiments, solder joint 103 comprises a compositional gradient of zinc concentration between bond pad 104 and bond pad 105. In some embodiments, solder joint 103 comprises a concentration of zinc adjacent to bond pad 104 that is higher than the concentration of zinc adjacent to bond pad 105.

In some embodiments, solder joint 103 comprises a compositional gradient of zinc concentration between bond pad 104 and bond pad 105. In some embodiments, solder joint 103 comprises a concentration of zinc adjacent to bond pad 105 that is higher than the concentration of zinc adjacent to bond pad 104.

In some embodiments, solder joint 103 comprises a compositional gradient of aluminum concentration between bond pad 104 and bond pad 105. In some embodiments, solder joint 103 comprises a concentration of aluminum adjacent to bond pad 105 that is higher than the concentration of zinc adjacent to bond pad 104.

In some embodiments, solder joint 103 comprises a compositional gradient of aluminum concentration between bond pad 104 and bond pad 105. In some embodiments, solder joint 103 comprises a concentration of aluminum adjacent to bond pad 104 that is higher than the concentration of zinc adjacent to bond pad 105.

In some embodiments, underfill 106 is between die 101 and substrate 102. In some embodiments, solder joint 103 is embedded in underfill 106. Underfill 106 may comprise materials comprising proprietary formulations in products used in microelectronic package assembly. Underfill 106 strengthens the solder bonds between die 101 and substrate 102.

FIGS. 2A-2G illustrate cross-sectional views, respectively, of a first embodiment of a method for fabricating package 100, having a dual solder joint embodiment between a die and substrate having an underfill, according to some embodiments of the disclosure.

Figure 2A:
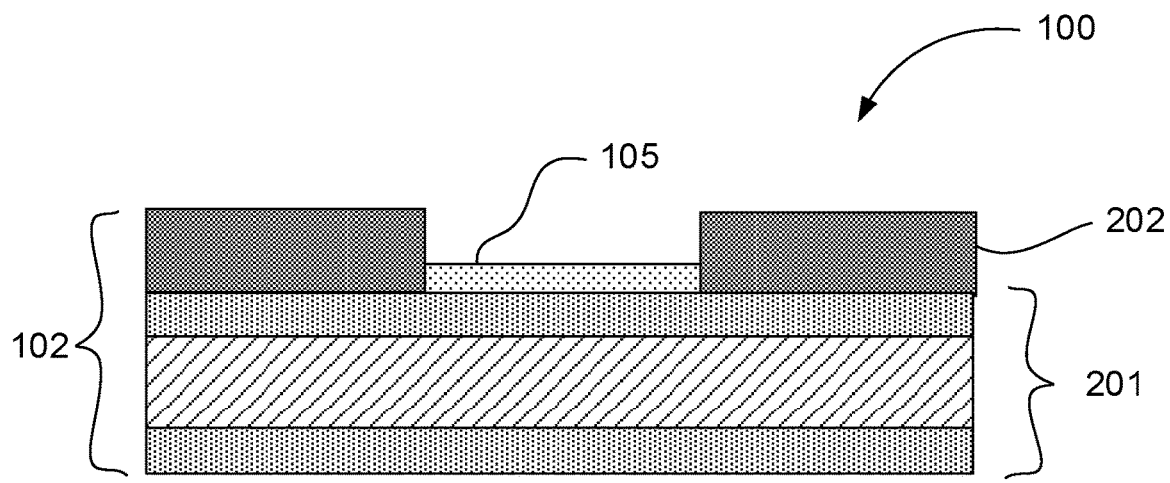
FIGS. 2A-2G illustrate cross-sectional views, respectively, of a first embodiment of a method for fabricating a package having a dual solder joint embodiment between a die and substrate having an underfill, according to some embodiments of the disclosure.

In the operation shown in FIG. 2A, substrate 102 is received. In some embodiments, substrate 102 comprises core 201, dielectric 202 and bond pad 105 embedded in dielectric 202.

Figure 2B:
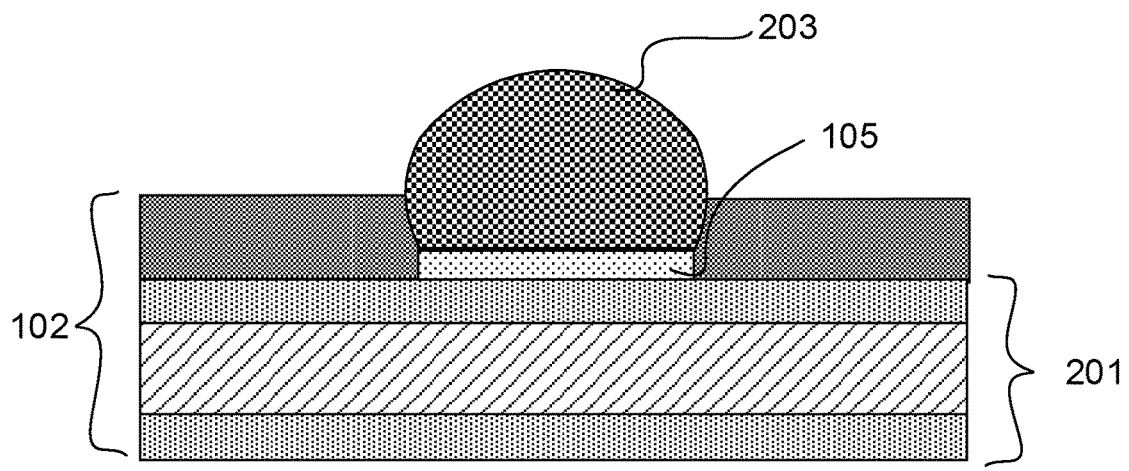

In the operation shown in FIG. 2B, first solder bump 203 is formed on bond pad 105. In some embodiments, first solder bump 203 is formed by a deposition process that is any of electroless plating, electrolytic plating (electroplating) or paste printing. Following the deposition process, first solder bump 203 is reflowed, according to some embodiments. In some embodiments, first solder bump 203 comprises a first solder metallurgy composition. According to some embodiments, the z-height of as-deposited first solder bump 203 may vary by as much as 20%, for example.

In some embodiments, the first solder metallurgy composition comprises mixtures comprising any of gold, aluminum, germanium, zinc, tin, bismuth and indium. An exemplary composition of first solder metallurgy composition may comprise 80% gold and 20% tin. A second example composition of first solder metallurgy may comprise 95% zinc and 5% aluminum. Here, the percentages are based on molar ratios. In some embodiments, first solder bump 203 has a first liquidus that ranges in temperature from 280° C. to 485° C. In some embodiments, the first liquidus temperature (TO of first solder bump 203 is dependent on the composition of first solder bump 203.

Figure 2C:
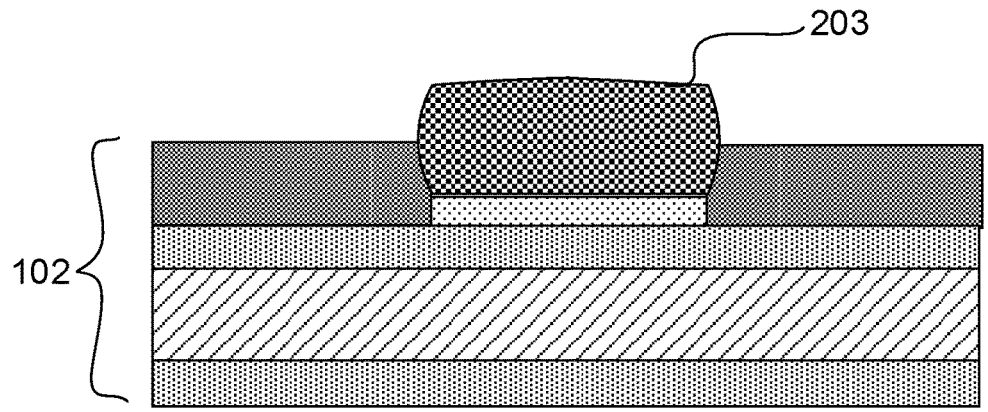

In the operation shown in FIG. 2C, first solder bump 203 is compressed to reduce its z-height to a predetermined value. In some embodiments, substrate 102 is mounted in a thermal compression bonding (TCB) tool and clamped between platens. In some embodiments, first solder bump 203 is soft enough to compress without application of heat. During compression, substrate 102 is held flat, and first solder bump 203 is substantially planarized with other solder bumps on substrate 102. According to some embodiments, die bonding, such as flip-chip bonding, is facilitated as the probability of contact between individual solder bumps on substrate 102 and bond pads or bumps on a die is substantially increased during die (chip) bonding in a subsequent operation.

Figure 2D:
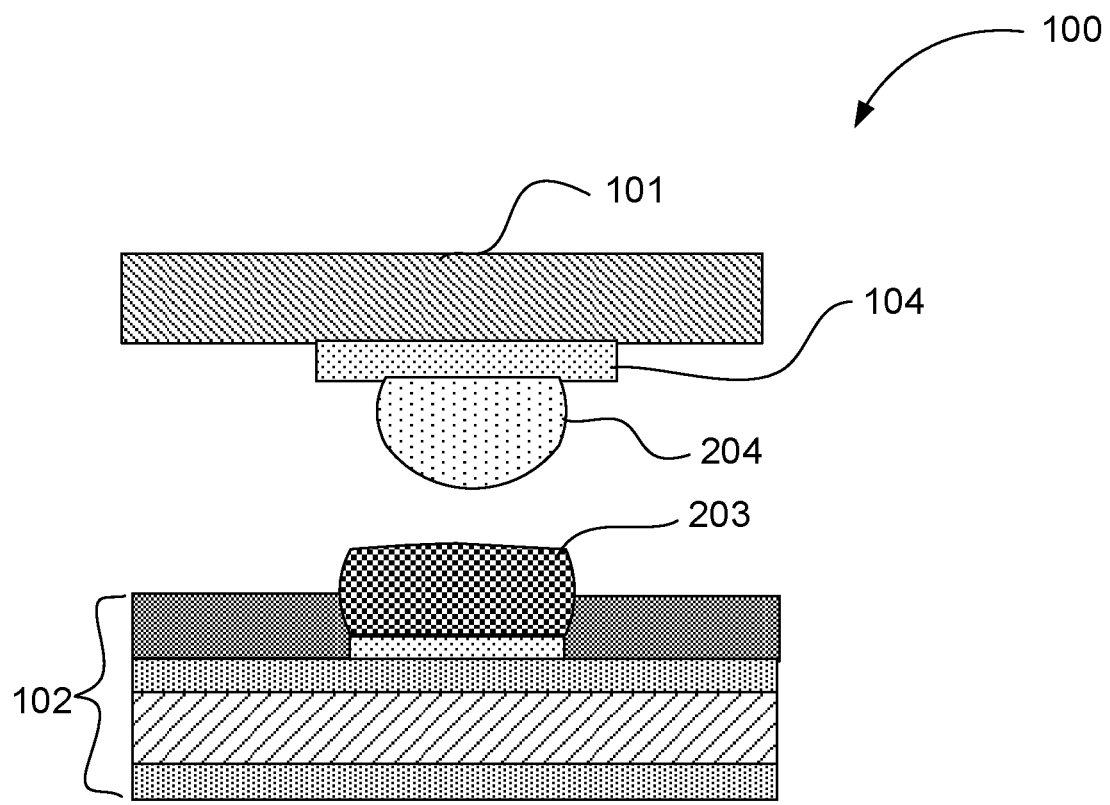

In the operation shown in FIG. 2D, die 101 is received with second solder bump 204 formed over bond pad 104 in an earlier operation. In some embodiments, second solder bump 204 is deposited by one of electroless deposition, electrolytic plating or paste printing. In some embodiments, second solder bump 204 has a substantially smaller volume than first solder bump 203. In the operation shown in FIG. 2D, die 101 is aligned with substrate 102 such that first solder bump 203 is aligned and juxtaposed with solder bump 204. In some embodiments, die 101 and substrate 102 are mounted in a TCB tool.

In some embodiments, second solder bump 204 comprises a second solder metallurgy composition. In some embodiments, the second solder metallurgy composition comprises metals such as, but not limited to, tin, silver, zinc, copper, bismuth and indium. An exemplary composition of second solder metallurgy composition may comprise 95.5% tin, 4% silver and 0.5% copper. A second example composition of second solder metallurgy may comprise 89% tin, 8% zinc and 3% bismuth. Here, the percentages are based on molar ratios. In some embodiments, second solder bump 204 has a second liquidus ($T_{L2}$) that ranges in temperature from 138° C. to 227° C. In some embodiments, the second liquidus temperature is dependent on the composition of second solder bump 204. In some embodiments, $T_{L2}$ is less than $T_{L1}$.

Figure 2E:
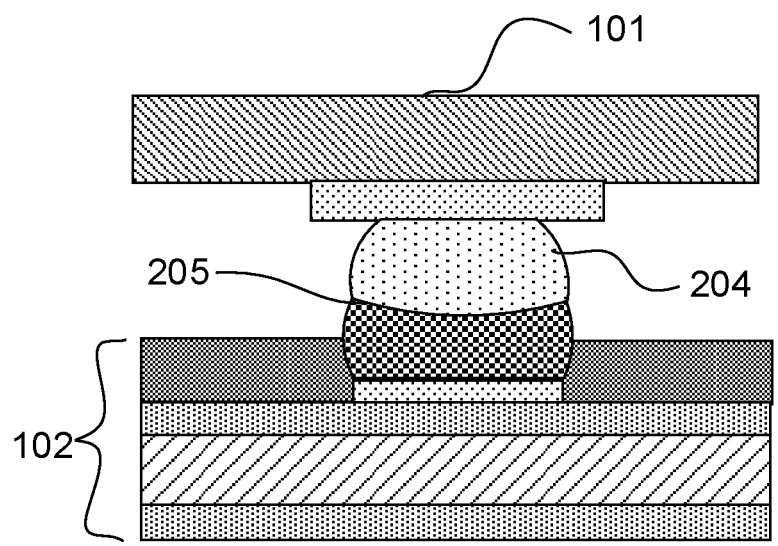

In the operation shown if FIG. 2E, die 101 is pressed to substrate 102 to abut second solder bump 204 against first solder bump 203. In some embodiments, the operation is performed in a TCB tool head. Die 101 and substrate 102 are compressed between heated platens. In some embodiments, the temperature of the platens is raised to the second liquidus temperature $T_{L2}$ or above, but below $T_{L1}$. Second solder bump 204 liquefies and flows at or above $T_{L2}$. In some embodiments, the platen temperature is ramped down to allow second solder bump to re-solidify.

In some embodiments, second solder bump 204 reflows over first solder bump 203, which does not melt during the operation. A metallic bond is formed between first solder bump 203 and second solder bump 204. In some embodiments, the relatively smaller volume of second solder bump 204 creates a partial solder joint 205 without flowing to neighboring solder bumps. In this way, solder bridging between neighboring bond pads is prevented or substantially mitigated. In some embodiments, partial solder joint 205 is temporary, and functions as a tack to hold die 101 to substrate 102 during subsequent operations before a permanent solder joint is formed by the reflow operation of first solder bump 203, described below.

Figure 2F:
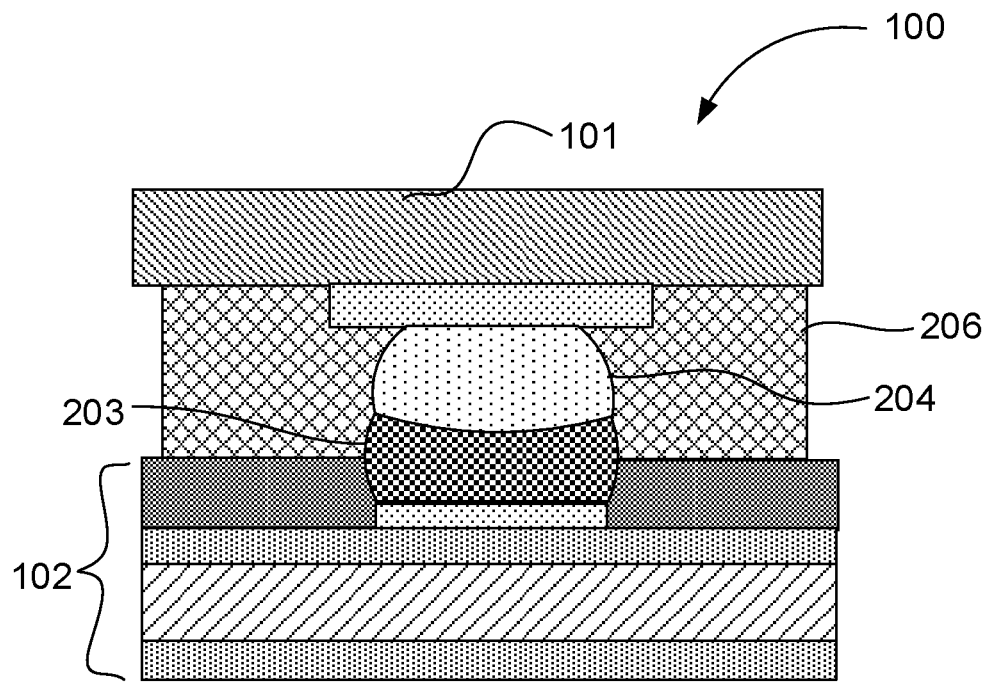

In the operation shown in FIG. 2F, capillary underfill (CUF) 206 is introduced between die 101 and substrate 102. In some embodiments, CUF 206 is injected between die 101 and substrate 102. In some embodiments, CUF 206 is introduced between die 101 and substrate 102 by capillary action. Methods to introduce CUF 206 between die 101 and substrate 102 are known in the industry, and may be employed to introduce CUF 206.

In some embodiments, CUF 206 protects solder joints and contributes to stiffening the bond between die 101 and substrate 102. According to some embodiments, CUF 206 confines solder from first solder bump 203 from bridging over to neighboring solder bumps, as described below.

Figure 2G:
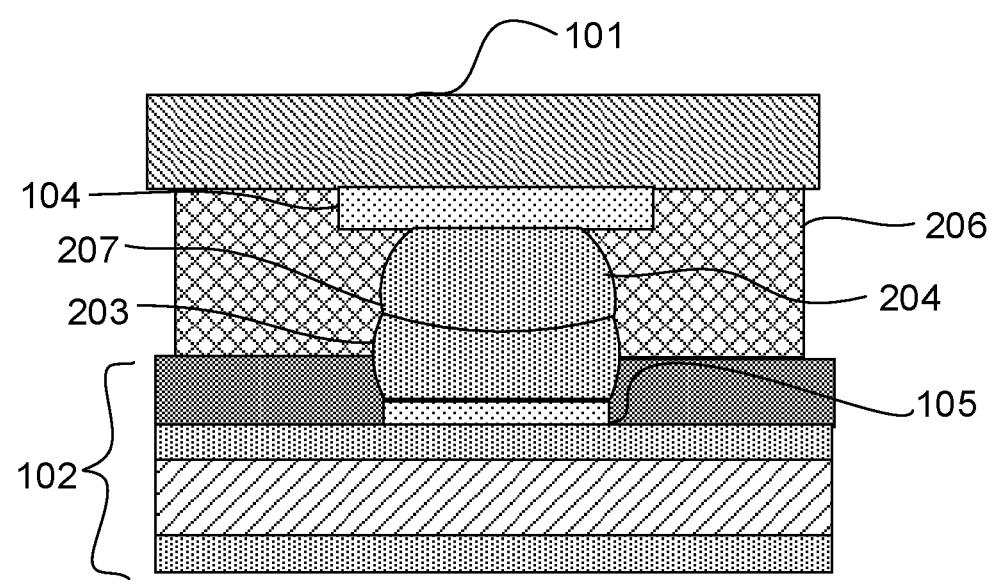

In the operation shown in FIG. 2G, the temperature of the platens is raised to the first liquidus temperature $T_{L1}$ or above. First solder bump 203 liquefies and flows at or above $T_{L1}$. Simultaneously, second solder bump 204 liquefies. In some embodiments, liquid solder from second solder bump 204 blends with liquid solder from first solder bump 203. In some embodiments, a compositional gradient forms during reflow, where the elements in first solder bump 203 have a highest concentration adjacent to bond pad 105 at substrate 102, with a lessening concentration toward bond pad 104 at die 101. Conversely, the elements of second solder bump 204 have a highest concentration adjacent to bond pad 105 at die 101, with a lessening concentration toward bond pad 104 at substrate 102. In some embodiments, the composition of the solder homogenizes during reflow.

As the volume of first solder bump 203 is larger relative to the volume of second solder bump 204, solder bridging would normally occur without the presence of CUF 206. In some embodiments, CUF 206 confines liquid solder from molten first solder bump 203 from flowing laterally. In some embodiments, solder bump 203 reflows and blends with solder bump 204, as described above, forming permanent solder joint 207. In some embodiments, the platen temperature is ramped down to allow second solder bump to re-solidify.

FIGS. 3A-3F illustrate cross-sectional views, respectively, of a second embodiment of a method for fabricating package 100, having a dual solder joint embodiment between a die and substrate having an underfill, according to some embodiments of the disclosure.

Figure 3A:
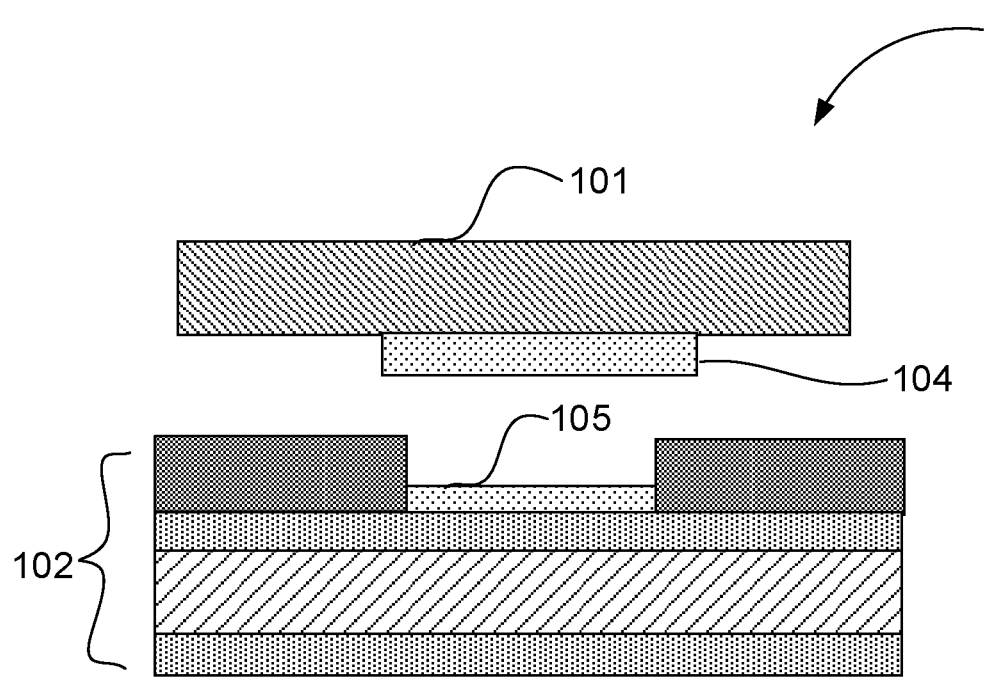
FIGS. 3A-3F illustrate cross-sectional views, respectively, of a second embodiment of a method for fabricating a package having a dual solder joint embodiment between a die and substrate having an underfill, according to some embodiments of the disclosure.

In the operation shown in FIG. 3A, die 101 and substrate 102 are received. Die 101 comprises bond pad 104, and substrate 102 comprises bond pad 105.

Figure 3B:
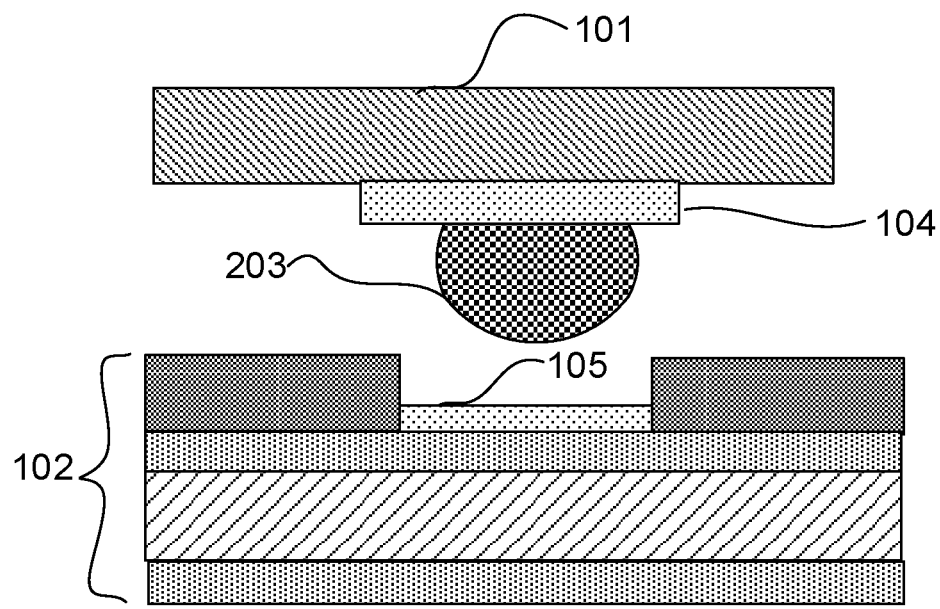

In the operation shown in FIG. 3B, first solder bump 203 is formed on bond pad 104 at die 101. In some embodiments, first solder bump 203 is formed by a deposition process that is any of electroless plating, electrolytic plating (electroplating) or paste printing.

Figure 3C:
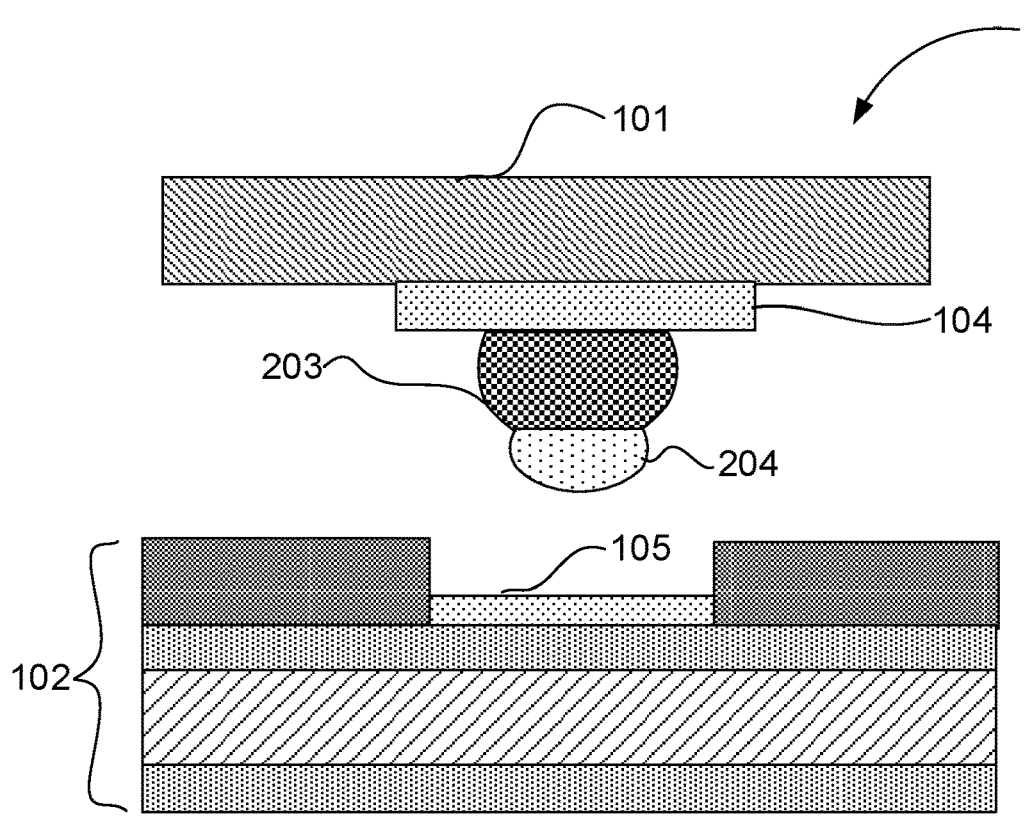

In the operation shown in FIG. 3C, second solder bump 204 is formed over first solder bump 203. In some embodiments, second solder bump 204 is formed by a deposition process that is any of electroless plating, electrolytic plating (e.g., electroplating) or paste printing. In some embodiments, second solder bump 204 has a relatively smaller volume than first solder bump 203 to reduce the risk of solder bridge formation during reflow, as described above. In some embodiments, the composition of first solder bump 203 and second solder bump 204 are the same as described above (e.g., FIG. 2D).

Figure 3D:
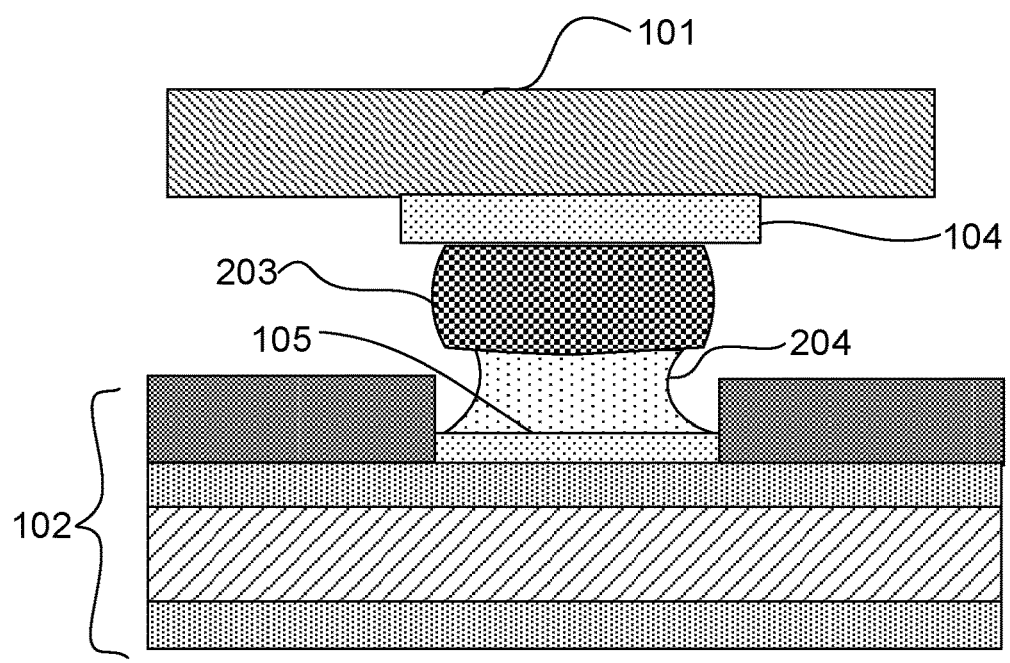

In the operation shown in FIG. 3D, bond pad 104 is juxtaposed with bond pad 105 to align second solder bump 204 with bond pad 105 on the substrate. In some embodiments, die 101 and substrate 102 are mounted on heated platens of a TCB tool head, where bond pads 104 and 105 face each other, in preparation for a bonding operation such as flip-chip bonding (C4). Die 101 and substrate 102 are pressed together so that second solder bump 204 is pressed to bond pad 105 on the substrate. In some embodiments, the temperature of the TCB tool head is raised to 112, the second liquidus temperature, liquefying and reflowing second solder bump 204. In some embodiments, solder from second solder bump 204 flows over bond pad 105 and first solder bump 203, creating a partial solder joint between first solder bump 203 and bond pad 105 on substrate 102.

As the partial solder joint is formed with first solder bump 203, the partial solder joint may be relatively weak. However, the partial solder joint is temporary and rigidly holds die 101 to substrate 102 during subsequent operations.

Figure 3E:
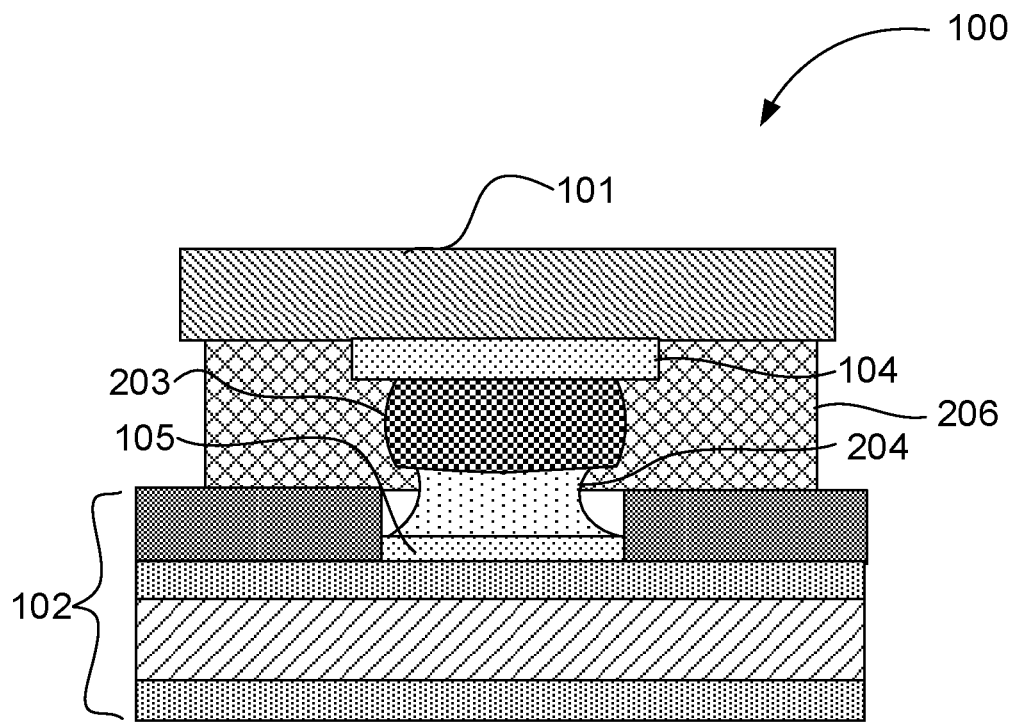

In the operation shown in FIG. 3E, CUF 206 is introduced. In some embodiments, CUF 206 is injected between die 101 and substrate 102. In some embodiments, CUF 206 is introduced between die 101 and substrate 102 by capillary action. Methods to introduce CUF 206 between die 101 and substrate 102 are known in the industry, and may be employed to introduce CUF 206.

In some embodiments, CUF 206 protects solder joints and contributes to stiffening the bond between die 101 and substrate 102, as described above. According to some embodiments, CUF 206 confines solder from first solder bump 203 from bridging over to neighboring solder bumps, as described below.

Figure 3F:
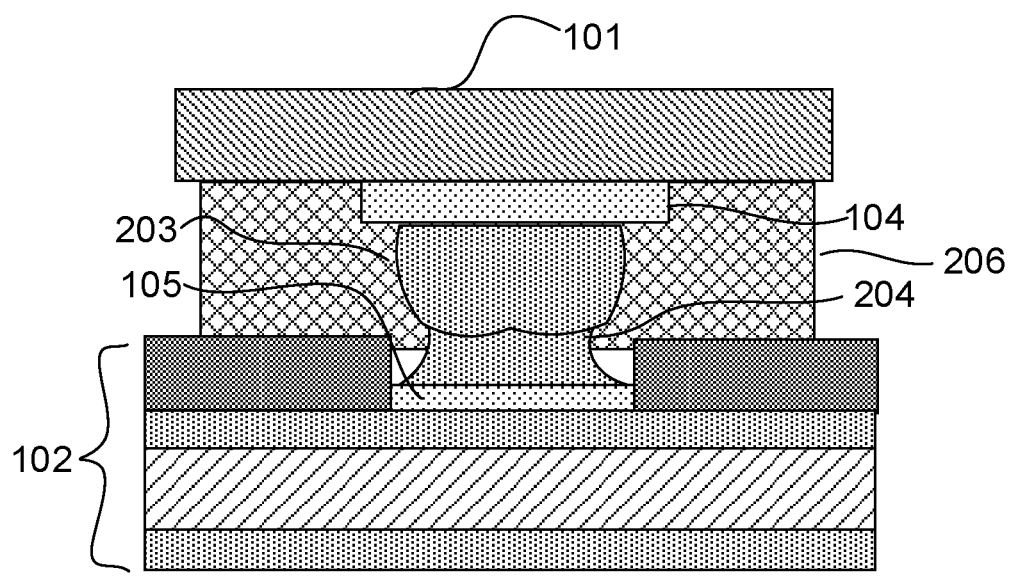

In the operation shown in FIG. 3F, the temperature of the platens is raised to the first liquidus temperature $T_{L1}$ or above. First solder bump 203 liquefies and flows at or above $T_{L1}$. Simultaneously, second solder bump 204 melts and reflows. In some embodiments, liquid solder from second solder bump 204 blends with liquid solder from first solder bump 203. In some embodiments, a compositional gradient forms during reflow, where the elements in first solder bump 203 have a highest concentration adjacent to bond pad 104 at die 101, with a lessening concentration toward bond pad 105 at substrate 102. Conversely, the elements of second solder bump 204 have a highest concentration adjacent to bond pad 105 at substrate 102, with a lessening concentration toward bond pad 104 at die 101. In some embodiments, the composition of the solder homogenizes during reflow.

As the volume of first solder bump 203 is larger relative to the volume of second solder bump 204, solder bridging would normally occur without the presence of CUF 206. In some embodiments, CUF 206 confines liquid solder from molten first solder bump 203 from flowing laterally. In some embodiments, solder bump 203 reflows and blends with solder bump 204, as described above, forming permanent solder joint 207. In some embodiments, the platen temperature is ramped down to allow second solder bump to re-solidify.

Figure 4:
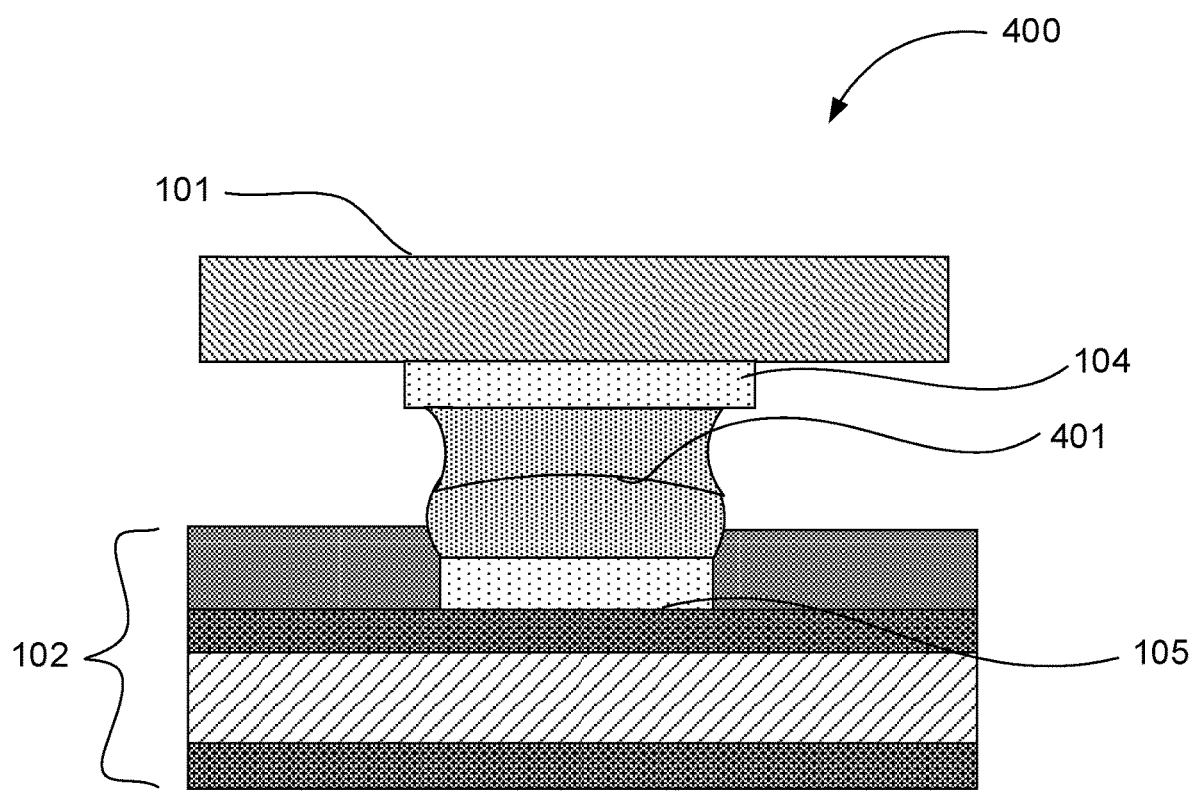
FIG. 4 illustrates a cross-sectional view of a second embodiment of a package having a dual solder joint embodiment between a die and a substrate, without an underfill, according to some embodiments of the disclosure.

FIG. 4 illustrates a cross-sectional view of a second embodiment of package 400, having a dual solder joint embodiment between a die and a substrate, without an underfill, according to some embodiments of the disclosure.

In FIG. 4, package 400 comprises die 101, substrate 102. Die 101 comprises bond pad 104, and substrate 102 comprises bond pad 105. Solder joint 401 is bonded between bond pads 104 and 105. Solder joint 103 is composed of metallurgies that may comprise, but are not limited to, metals such as tin, silver, copper, bismuth, zinc, indium, gold, aluminum, and germanium. In some embodiments, solder joint 401 comprises a compositional gradient of tin concentration between bond pad 104 and bond pad 105. In some embodiments, solder joint 401 comprises a concentration of tin adjacent to bond pad 104 on die 101 that is higher than the concentration of tin adjacent to bond pad 105 on substrate 102.

In some embodiments, an intermetallic compound (IMC) is formed at the interface between bond pad 105 on substrate 102, and solder joint 401. In some embodiments, the IMC comprises copper and gold. In some embodiments, the IMC comprises copper and zinc. In some embodiments, the IMC comprises copper and silver. In some embodiments, the IMC comprises copper and bismuth. In some embodiments, the IMC comprises copper and tin. In some embodiments, the IMC comprises copper and indium. In some embodiments, the IMC comprises copper and germanium. In some embodiments, the IMC has a melting temperature that is over 500° C.

FIGS. 5A-5D illustrate cross-sectional views, respectively, of a method for fabricating package 400, having a dual solder joint embodiment between a die and a substrate, without an underfill, according to some embodiments of the disclosure.

Figure 5A:
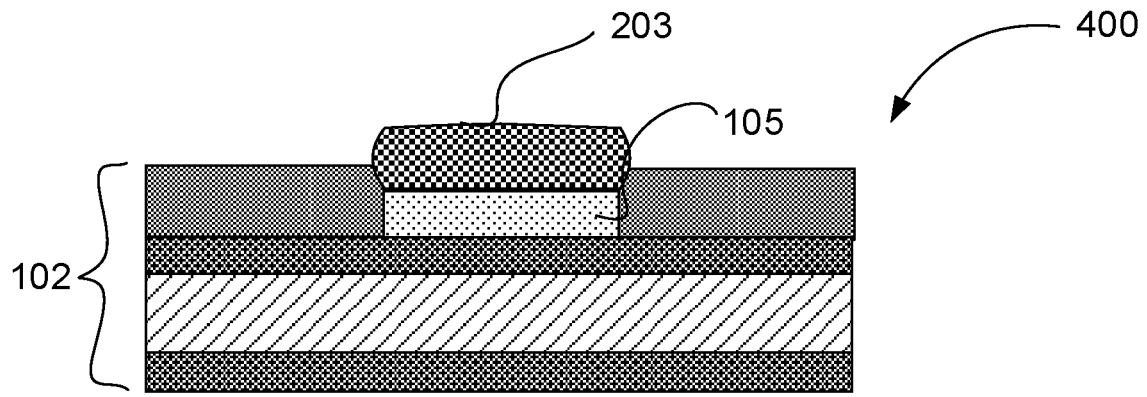
FIGS. 5A-5D illustrate cross-sectional views, respectively, of a method for fabricating a package having a dual solder joint embodiment between a die and a substrate, without an underfill, according to some embodiments of the disclosure.

In the operation shown in FIG. 5A, substrate 102 is received having first solder bump 203 deposited in an earlier operation over bond pad 105. In some embodiments, first solder bump 203 is formed by a deposition process that is any of electroless plating, electrolytic plating (e.g., electroplating) or paste printing. In some embodiments, first solder bump 203 comprises a first solder metallurgy composition. In some embodiments, the first solder metallurgy composition comprises mixtures comprising any of gold, aluminum, germanium, zinc, tin, bismuth and indium. An exemplary composition of first solder metallurgy composition may comprise 80% gold and 20% tin. A second example composition of first solder metallurgy may comprise 95% zinc and 5% aluminum. Here, the percentages are based on molar ratios. In some embodiments, first solder bump 203 has a first liquidus that ranges in temperature from 280° C. to 485° C. In some embodiments, the first liquidus temperature ($T_{L1}$) of first solder bump 203 is dependent on the composition of first solder bump 203.

In some embodiments, solder bump 203 is compressed to flatness (substantially flat profile) in a previous operation to reduce its z-height to a predetermined value. In some embodiments, substrate 102 is mounted in a thermal compression bonding (TCB) tool and clamped between platens. In some embodiments, first solder bump 203 is soft enough to compress without application of heat. During compression, substrate 102 is held flat, and first solder bump 203 is substantially planarized with other solder bumps on substrate 102. According to some embodiments, die bonding, such as flip-chip bonding, is facilitated as the probability of contact between individual solder bumps on substrate 102 and bond pads or bumps on a die is substantially increased during die (chip) bonding in a subsequent operation.

Figure 5B:
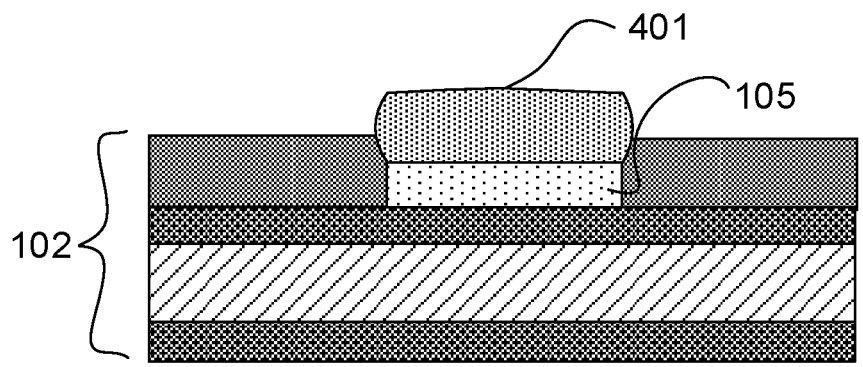

In the operation shown in FIG. 5B, intermetallic compound (IMC) 401 is formed by heating substrate 102 to temperatures below $T_{L1}$, the liquidus temperature of first solder bump 203. An IMC is formed by thermally-driven inter-diffusion of atoms at an interface between two metals. In some embodiments, IMC 401 is formed from first solder bump 203 by temperature cycling substrate 102 mounted in a TCB tool. In some embodiments, inter-diffusion of copper atoms from bond pad 105 into first solder bump 203 at the interface contributes to forming IMC 401.

In some embodiments, IMC 401 comprises copper and gold. In some embodiments, the IMC comprises copper and zinc. In some embodiments, IMC 401 comprises copper and silver. In some embodiments, IMC 401 comprises copper and bismuth. In some embodiments, the IMC comprises copper and tin. In some embodiments, IMC 401 comprises copper and indium. In some embodiments, IMC 401 has a melting temperature that is over 500° C.

Figure 5C:
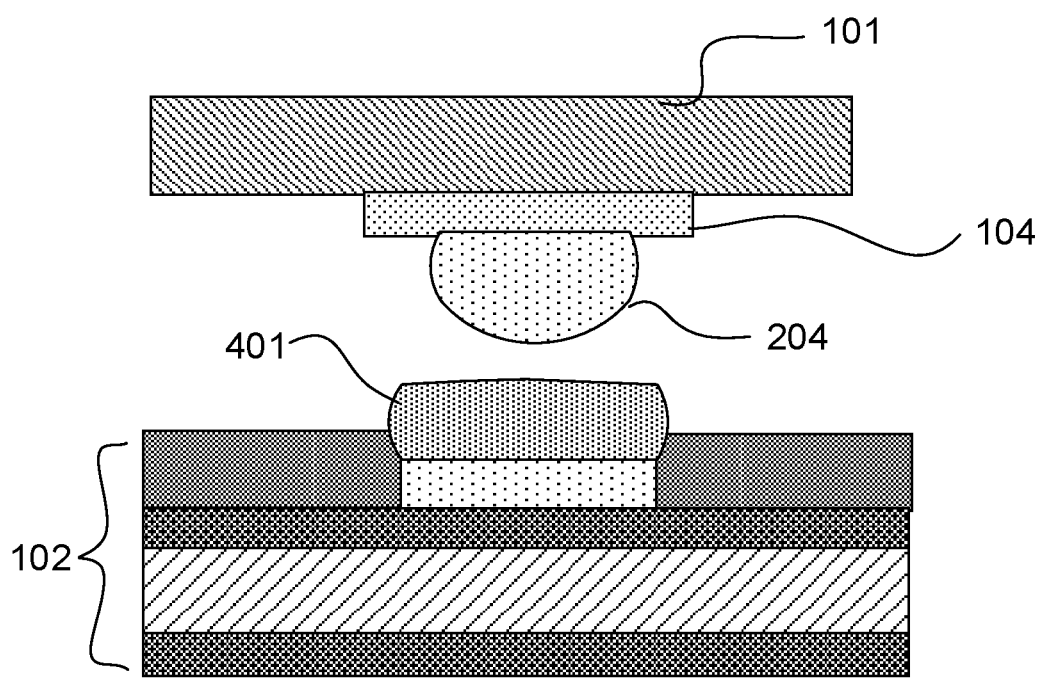

In the operation shown in FIG. 5C, die 101 is received. In some embodiments, die 101 is bumped with second solder bump 204. In some embodiments, second solder bump 204 is formed by a deposition process that is any of electroless plating, electrolytic plating (e.g., electroplating) or paste printing. In some embodiments, second solder bump 204 comprises a second solder metallurgy composition. In some embodiments, the second solder metallurgy composition comprises metals such as, but not limited to, tin, silver, zinc, copper, bismuth and indium. An exemplary composition of second solder metallurgy composition may comprise 95.5% tin, 4% silver and 0.5% copper. A second example composition of second solder metallurgy may comprise 89% tin, 8% zinc and 3% bismuth. All percentages are based on molar ratios. In some embodiments, second solder bump 204 has a second liquidus ($T_{L2}$) that ranges in temperature from 138° C. to 227° C. In some embodiments, the second liquidus temperature is dependent on the composition of second solder bump 204.

In some embodiments, die 101 is aligned with substrate 102 and second solder bump 204 is juxtaposed with IMC 401. In some embodiments, die 101 and substrate 102 are mounted in a heated TCB tool head. In some embodiments, second solder bump 204 is abutted against IMC 401 in preparation for solder bonding.

Figure 5D:
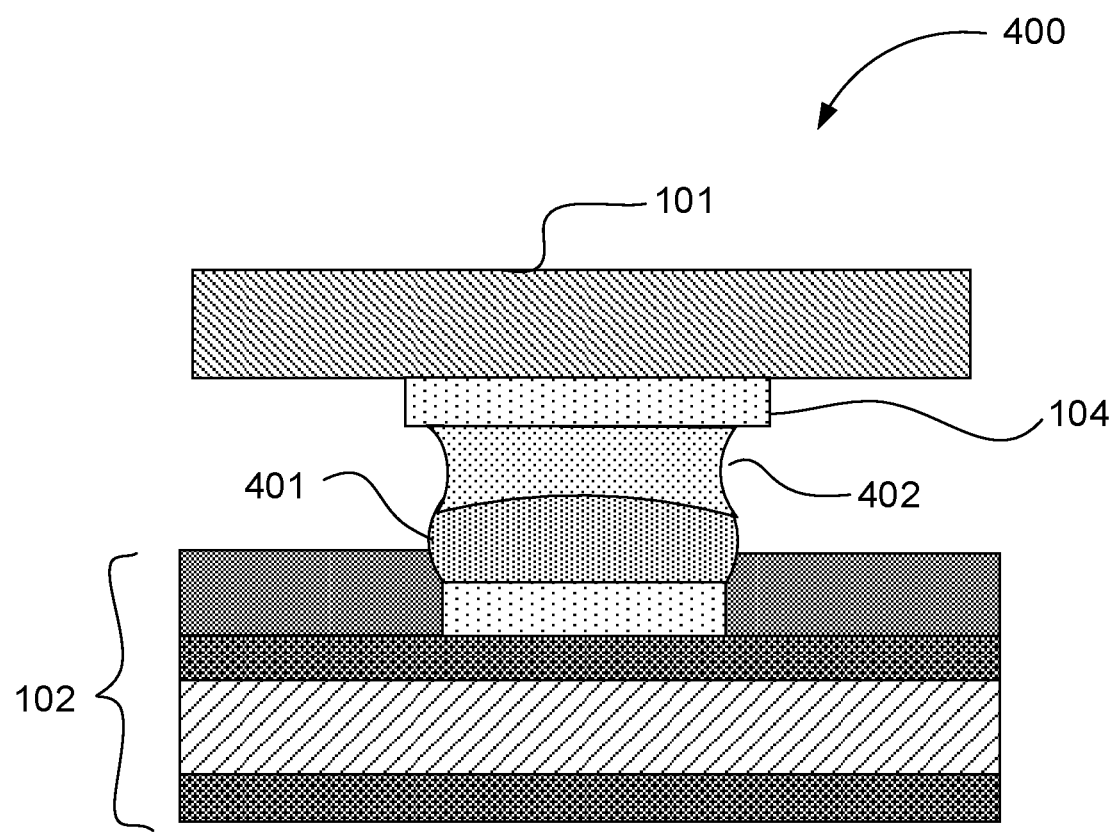

In the operation shown in FIG. 5D, solder joint 402 is formed. In some embodiments, second solder bump 204 is reflowed by raising TCB head temperature to temperatures at or above $T_{L2}$, the liquidus temperature of second solder bump 204. In some embodiments, solder joint 402 is a permanent solder joint, as IMC 401 has a melting point above 500° C., and does not melt during reflow of second solder bump 204. In some embodiments, solder bump 204 has a volume small enough to form a meniscus over IMC 401 when liquefied, and does not flow laterally, and remains over IMC 401. In some embodiments, an underfill, such as CUF 206 in FIGS. 3E and 3F, is not included, as the risk of solder bridge formation is substantially reduced.

Figure 6:
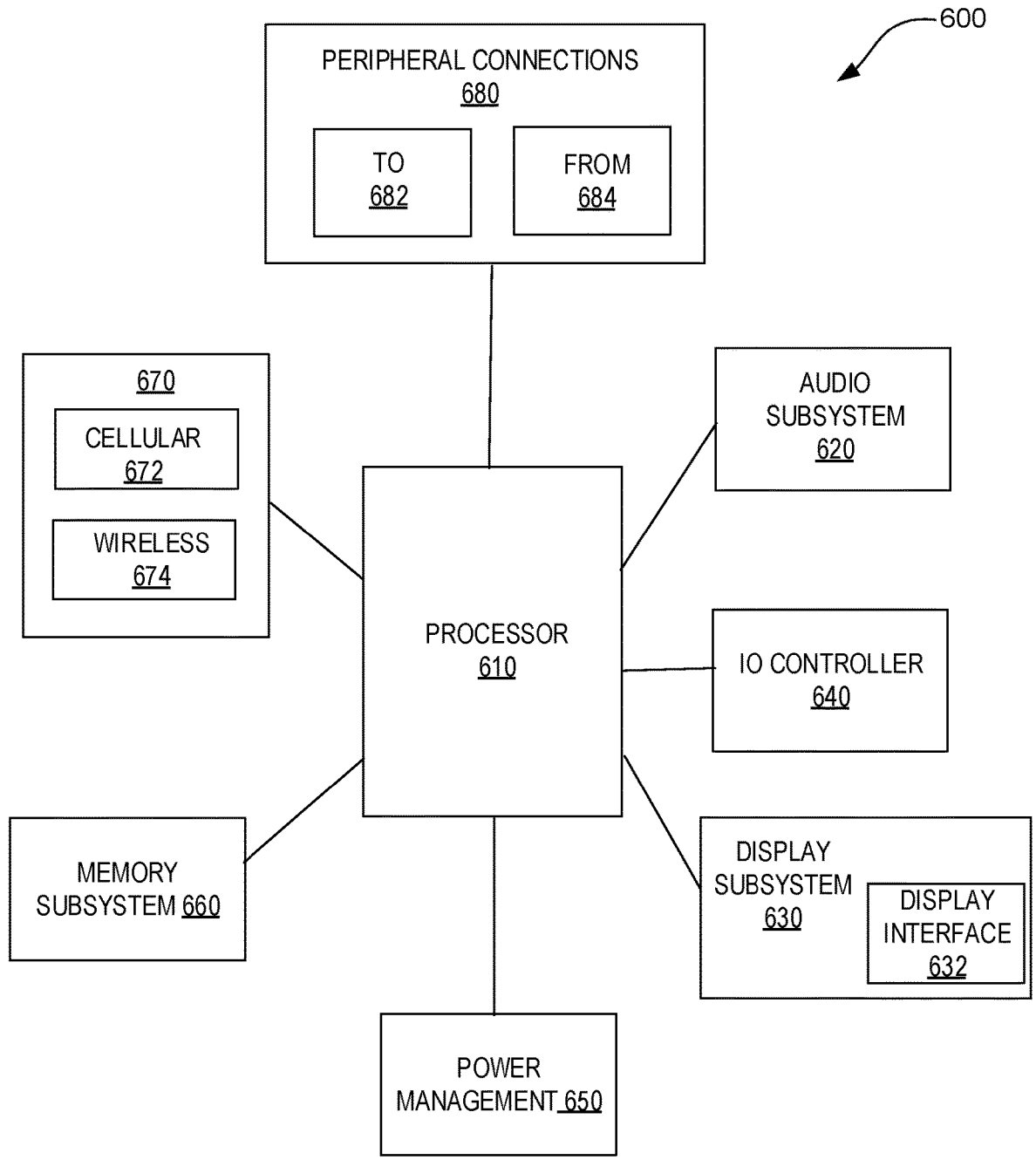
FIG. 6 illustrates a package having a dual solder joint embodiment between a die and a substrate, fabricated according to the disclosed method, as part of a system-on-chip (SoC) package in an implementation of computing device, according to some embodiments of the disclosure.

FIG. 6 illustrates a package having a dual solder joint embodiment between a die and a substrate, fabricated according to the disclosed method, as part of a system-on-chip (SoC) package in an implementation of computing device, according to some embodiments of the disclosure.

FIG. 6 illustrates a block diagram of an embodiment of a mobile device in which flat surface interface connectors could be used. In some embodiments, computing device 600 represents a mobile computing device, such as a computing tablet, a mobile phone or smart-phone, a wireless-enabled e-reader, or other wireless mobile device. It will be understood that certain components are shown generally, and not all components of such a device are shown in computing device 600.

In some embodiments, computing device 600 includes a first processor 610. The various embodiments of the present disclosure may also comprise a network interface within 670 such as a wireless interface so that a system embodiment may be incorporated into a wireless device, for example, cell phone or personal digital assistant.

In one embodiment, processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting the computing device 600 to another device. The processing operations may also include operations related to audio I/O and/or display I/O.

In one embodiment, computing device 600 includes audio subsystem 620, which represents hardware (e.g., audio hardware and audio circuits) and software (e.g., drivers, codecs)

components associated with providing audio functions to the computing device. Audio functions can include speaker and/or headphone output, as well as microphone input. Devices for such functions can be integrated into computing device 600, or connected to the computing device 600. In one embodiment, a user interacts with the computing device 600 by providing audio commands that are received and processed by processor 610.

Display subsystem 630 represents hardware (e.g., display devices) and software (e.g., drivers) components that provide a visual and/or tactile display for a user to interact with the computing device 600. Display subsystem 630 includes display interface 632 which includes the particular screen or hardware device used to provide a display to a user. In one embodiment, display interface 632 includes logic separate from processor 610 to perform at least some processing related to the display. In one embodiment, display subsystem 630 includes a touch screen (or touch pad) device that provides both output and input to a user.

I/O controller 640 represents hardware devices and software components related to interaction with a user. I/O controller 640 is operable to manage hardware that is part of audio subsystem 620 and/or display subsystem 630. Additionally, I/O controller 640 illustrates a connection point for additional devices that connect to computing device 600 through which a user might interact with the system. For example, devices that can be attached to the computing device 600 might include microphone devices, speaker or stereo systems, video systems or other display devices, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of the computing device 600. Additionally, audio output can be provided instead of, or in addition to display output. In another example, if display subsystem 630 includes a touch screen, the display device also acts as an input device, which can be at least partially managed by I/O controller 640. There can also be additional buttons or switches on the computing device 600 to provide I/O functions managed by I/O controller 640.

In one embodiment, I/O controller 640 manages devices such as accelerometers, cameras, light sensors or other environmental sensors, or other hardware that can be included in the computing device 600. The input can be part of direct user interaction, as well as providing environmental input to the system to influence its operations (such as filtering for noise, adjusting displays for brightness detection, applying a flash for a camera, or other features).

In one embodiment, computing device 600 includes power management 650 that manages battery power usage, charging of the battery, and features related to power saving operation. Memory subsystem 660 includes memory devices for storing information in computing device 600. Memory can include nonvolatile (state does not change if power to the memory device is interrupted) and/or volatile (state is indeterminate if power to the memory device is interrupted) memory devices. Memory subsystem 660 can store application data, user data, music, photos, documents, or other data, as well as system data (whether long-term or temporary) related to the execution of the applications and functions of the computing device 600.

Elements of embodiments are also provided as a machine-readable medium (e.g., memory 660) for storing the computer-executable instructions. The machine-readable medium (e.g., memory 660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 670 includes hardware devices (e.g., wireless and/or wired connectors and communication hardware) and software components (e.g., drivers, protocol stacks) to enable the computing device 600 to communicate with external devices. The computing device 600 could be separate devices, such as other computing devices, wireless access points or base stations, as well as peripherals such as headsets, printers, or other devices.

Network interface 670 can include multiple different types of connectivity. To generalize, the computing device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 680 include hardware interfaces and connectors, as well as software components (e.g., drivers, protocol stacks) to make peripheral connections. It will be understood that the computing device 600 could both be a peripheral device ("to" 682) to other computing devices, as well as have peripheral devices ("from" 684) connected to it. The computing device 600 commonly has a "docking" connector to connect to other computing devices for purposes such as managing (e.g., downloading and/or uploading, changing, synchronizing) content on computing device 600. Additionally, a docking connector can allow computing device 600 to connect to certain peripherals that allow the computing device 600 to control content output, for example, to audiovisual or other systems.

In addition to a proprietary docking connector or other proprietary connection hardware, the computing device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1 is an apparatus comprising an integrated circuit (IC) package having at least one solder bond pad, a die having at least one solder bond pad, wherein the die is bonded to the IC package by at least one solder joint between the at least one bond pad of the die, and the at least one bond pad of the IC package, and an underfill material between the IC package and the die, wherein the at least one solder joint is embedded in the underfill material, and wherein the at least one solder joint comprises a first metallurgy and a second metallurgy.

Example 2 includes all of the features of example 1, wherein the first metallurgy comprises one of: gold, aluminum, germanium, zinc, tin, bismuth or indium.

Example 3 includes all of the features of example 1, wherein the second metallurgy comprises any one of tin, silver, zinc, coper, bismuth or indium.

Example 4 includes all of the features of any one of examples 1 through 3, wherein the at least one solder joint comprises a compositional gradient, the compositional gradient comprising a higher concentration of tin near the at least one bond pad of the die than near the at least one bond pad of the IC package.

Example 5 includes all of the features of any one of examples 1 through 3, wherein the at least one solder joint comprises a compositional gradient, the compositional gradient comprising a higher concentration of tin near the at least one substrate bond pad of the IC package than near the at least one bond pad of the die.

Example 6 includes all of the features of any one of examples 1 through 5, wherein a bump is over the at least one bond pad of the IC package, and wherein the top of the bump is substantially flat.

Example 7 includes all of the features of example 6, wherein the bump comprises an intermetallic compound comprising any one of gold, aluminum or germanium.

Example 8 is a system comprising a memory and a processor coupled to the memory, the processor comprising an integrated circuit (IC) package having at least one solder bond pad; a die having at least one solder bond pad, wherein the die is bonded to the IC package by at least one solder joint between the at least one bond pad of the die, and the at least one bond pad of the IC package, and an underfill material between the IC package and the die, wherein the at least one solder joint is embedded in the underfill material, and wherein the at least one solder joint comprises a first metallurgy and a second metallurgy, wherein the processor is wirelessly coupled to an external device.

Example 9 includes all of the features of example 8, wherein the one or more solder joints comprises an intermetallic compound over a IC package substrate bond pad, the intermetallic compound comprising one of: copper and tin.

Example 10 includes all of the features of examples 8 or 9, wherein the at least one solder joint comprises a compositional gradient, the compositional gradient comprising a higher concentration of tin near the at least one bond pad of the die than near the at least one bond pad of the IC package.

Example 11 includes all of the features of examples 8 or 9, wherein the at least one solder joint comprises a compositional gradient, the compositional gradient comprising a higher concentration of tin near the at least one bond pad of the IC package than near the at least one bond pad of the die.

Example 12 includes all of the features of any one of examples 8 through 11, wherein the first metallurgy comprises one of: gold, aluminum, germanium, zinc, tin, bismuth or indium.

Example 13 includes all of the features of any one of examples 8 through 11, wherein the second metallurgy comprises any one of: tin, silver, zinc, copper, bismuth or indium.

Example 14 is an IC package, comprising at least one solder bond pad, a die having at least one solder bond pad, wherein the die is bonded to the IC package by at least one solder joint between the solder bond pad of the die and the solder bond pad of the IC package, wherein the at least one solder joint comprises a first portion adjacent to a second portion, wherein the first portion has a substantially flat profile, and wherein the first portion comprises a first metallurgy, and the second portion comprises a second metallurgy, and an underfill material between the IC package and the die, wherein the at least one solder joint is embedded in the underfill material, and wherein the at least one solder joint comprises a first metallurgy and a second metallurgy.

Example 15 includes all of the features of example 14, wherein the first portion of the solder joint has a substantially flat profile and comprises an intermetallic compound, and wherein the intermetallic compound comprises any one of gold, silver, copper, aluminum, zinc, bismuth, tin, indium, germanium.

Example 16 is a method comprising aligning a die to an IC package for bonding, wherein the die is pressed to the IC package, wherein a first bond pad on the die is juxtaposed over a second bond pad on the IC package and an interface comprising a first layer having a first solder metallurgy and a second layer having a second solder metallurgy is between a first bond pad on the die and a second bond pad on the IC package, and wherein the first layer is adjacent to the first bond pad and the second layer is adjacent to the second bond pad, reflowing the first layer to form a partial solder joint between the first bond pad and the second bond pad and reflowing the second layer to form a complete solder joint between the first bond pad and the second bond pad, wherein the second reflow temperature is higher than the first reflow temperature.

Example 17 includes all of the features of example 16, wherein the liquidus temperature of the first layer is lower than the liquidus temperature of the second layer.

Example 18 includes all of the features of examples 16 or 17, wherein aligning a die to an IC package substrate comprises depositing the first layer over the first bond pad, depositing the second layer over the second bond pad, flattening the second layer, juxtaposing the first bond pad over the second bond pad, and pressing the first bond pad to the second bond pad.

Example 19 includes all of the features of any one of examples 16 through 18, wherein aligning a die to an IC package comprises depositing the first layer over the first bond pad, depositing the second layer over the second bond pad, flattening the second layer, forming a saturated intermetallic compound between the second layer and the second bond pad, juxtaposing the first bond pad over the second bond pad, and pressing the first bond pad to the second bond pad.

Example 20 includes all of the features of any one of examples 16 through 19, wherein aligning a die to an IC package substrate comprises depositing the first layer over the first bond pad, depositing the second layer over the second bond pad, flattening the second layer, juxtaposing the first bond pad over the second bond pad, and pressing the first bond pad to the second bond pad.

Example 21 includes all of the features of any one of examples 16 through 20, wherein reflowing the first layer to form a partial solder joint between the first bond pad and the second bond pad comprises reflowing the first layer at a first reflow temperature.

Example 22 includes all of the features of any one of examples 16 through 21, wherein reflowing the second layer to form a complete solder joint between the first bond pad and the second bond pad comprises reflowing the second layer at a second reflow temperature, wherein the second reflow temperature is higher than the first reflow temperature.

Example 23 includes all of the features of any one of examples 16 through 22, further comprising injecting a capillary underfill material between the die and the IC package substrate to embed the partial solder joint, and curing the capillary underfill material.

Example 24 includes all of the features of any one of examples 20 through 23, wherein depositing the second layer over the second bond pad comprises one of electroless plating, electrolytic plating or paste printing.

Example 25 includes all of the features of any one of examples 16 through 24, wherein pressing the first bond pad to the second bond pad comprises pressing the die to the IC package substrate in a thermocompression bonding tool.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

The invention claimed is:

1. A method, comprising:
providing, between a first bond pad of a die and a second bond pad of an integrated circuit (IC) package, a first structure comprising a first solder metallurgy and, between the first structure and one of the first bond pad or the second bond pad, a second structure comprising a second solder metallurgy;
reflowing, prior to underfill, the first structure at a first temperature below a liquidus temperature of the second structure to form a first solder joint between the first bond pad and the second bond pad;
forming an underfill material between the die and the IC package and adjacent the first solder joint; and
reflowing, after said forming the underfill material, the first and second structures at a second temperature above the liquidus temperature of the second structure to form a second solder joint between the first bond pad and the second bond pad.

2. The method of claim 1, wherein the first structure is between the first bond pad and the second structure.

3. The method of claim 2, further comprising:
forming the second structure on the second bond pad by depositing a bump comprising the first second solder metallurgy and compressing the bump to form the second structure.

4. The method of claim 3, further comprising:
forming the first structure on the first bond pad.

5. The method of claim 2, wherein the first structure is on the first bond pad, the second structure is on the second bond pad, and the first solder joint is formed at an interface between the first and second structures.

6. The method of claim 1, wherein the second structure is between the first bond pad and the first structure.

7. The method of claim 6, further comprising:
forming the second structure on the first bond pad; and
forming the first structure on the second structure.

8. The method of claim 7, wherein the first solder joint is formed at an interface between the first structure and the second bond pad.

9. The method of claim 1, wherein the first structure has a volume less than a volume of the second structure.

10. The method of claim 1, wherein the first structure comprises one or more of tin, silver, zinc, copper, bismuth and indium and the second structure comprises one or more of gold, aluminum, germanium, zinc, tin, bismuth, or indium.

11. The method of claim 1, wherein the first structure comprises not less than 89% tin and the second structure comprises not less than 80% gold or not less than 95% zinc.

12. The method of claim 11, wherein the first structure further comprises silver, copper, zinc or bismuth.

13. A method, comprising:
providing a first structure comprising a first solder metallurgy on a first bond pad of a die;
providing a second structure comprising a second solder metallurgy on a second bond pad of an integrated circuit (IC) package;
contacting the first structure and the second structure;
reflowing, prior to underfill, the first structure at a first temperature below a liquidus temperature of the second structure to form a first solder joint between the first structure and the second structure;

forming an underfill material between the die and the IC package and adjacent the first solder joint; and reflowing, after said forming the underfill material, the first and second structures at a second temperature above the liquidus temperature of the second structure to form a second solder joint between the first bond pad and the second bond pad.

14. The method of claim 13, wherein the first structure has a volume less than a volume of the second structure.

15. The method of claim 13, wherein the first structure comprises one or more of tin, silver, zinc, copper, bismuth and indium and the second structure comprises one or more of gold, aluminum, germanium, zinc, tin, bismuth, or indium.

16. The method of claim 13, wherein the first structure comprises not less than 89% tin and the second structure comprises not less than 80% gold or not less than 95% zinc.

17. A method, comprising:

providing a first structure comprising a first solder metallurgy on a first bond pad of a die;

providing a second structure comprising a second solder metallurgy on the first structure;

contacting the second structure to a second bond pad of an integrated circuit (IC) package;

reflowing, prior to underfill, the second structure at a first temperature below a liquidus temperature of the first structure to form a first solder joint between the second structure and the second bond pad;

forming an underfill material between the die and the IC package and adjacent the first solder joint; and reflowing, after said forming the underfill material, the first and second structures at a second temperature above the liquidus temperature of the first structure to form a second solder joint between the first bond pad and the second bond pad.

18. The method of claim 17, wherein the first structure has a volume less than a volume of the second structure.

19. The method of claim 17, wherein the first structure comprises one or more of tin, silver, zinc, copper, bismuth and indium and the second structure comprises one or more of gold, aluminum, germanium, zinc, tin, bismuth, or indium.

20. The method of claim 17, wherein the first structure comprises not less than 89% tin and the second structure comprises not less than 80% gold or not less than 95% zinc.

* * * * *